(12) United States Patent
Heun et al.

(10) Patent No.: US 9,368,726 B2
(45) Date of Patent: Jun. 14, 2016

(54) POLYMERS CONTAINING STRUCTURAL UNITS WHICH HAVE ELECTRON-TRANSPORT PROPERTIES

(75) Inventors: Susanne Heun, Bad Soden (DE); Aurélie Ludemann, Frankfurt am Main (DE); Rémi Manouk Anémian, Seoul (KR)

(73) Assignee: Merck Patent GmbH (DE)

( * ) Notice: Subject to any disclaimer, the term of this patent is extended or adjusted under 35 U.S.C. 154(b) by 503 days.

(21) Appl. No.: 13/813,032

(22) PCT Filed: Jul. 8, 2011

(86) PCT No.: PCT/EP2011/003430
§ 371 (c)(1),
(2), (4) Date: Jan. 29, 2013

(87) PCT Pub. No.: WO2012/016627
PCT Pub. Date: Feb. 9, 2012

(65) Prior Publication Data
US 2013/0126791 A1     May 23, 2013

(30) Foreign Application Priority Data
Aug. 2, 2010   (DE) .......................... 10 2010 033 080

(51) Int. Cl.
*C08G 61/02*     (2006.01)
*H01L 51/00*     (2006.01)
(Continued)

(52) U.S. Cl.
CPC ............ *H01L 51/0043* (2013.01); *C08G 61/02* (2013.01); *C08G 61/122* (2013.01);
(Continued)

(58) Field of Classification Search
None
See application file for complete search history.

(56) References Cited

U.S. PATENT DOCUMENTS 5,621,131 A * 4/1997 Kreuder .................. C07C 17/35
                                                              528/403
6,541,602 B1 * 4/2003 Spreitzer et al. ............. 528/394
(Continued)

FOREIGN PATENT DOCUMENTS

CN          1500104 A      5/2004
CN          1768090 A      5/2006
(Continued)

OTHER PUBLICATIONS

Shu et al. "Highly Efficient Blue-Light-Emitting Diodes from Polyfluorene Containing Bipolar Pendant Groups" Macromolecules 2003, 36, 6698-6703.*
(Continued)

*Primary Examiner* — Robert S Loewe
(74) *Attorney, Agent, or Firm* — Drinker Biddle & Reath LLP

(57) ABSTRACT

The present invention relates to a polymer which contains at least one structural unit which has electron-transport properties, to processes for the preparation thereof and to mixtures (blends), solutions and formulations which comprise these polymers. Furthermore, the present invention relates to the use of these polymers in electronic devices, in particular in organic electro-luminescent devices, so-called OLEDs (OLED=organic light emitting diodes), and to these organic electroluminescent devices themselves. The polymers according to the invention exhibit improved efficiency, in particular on use in OLEDs.

20 Claims, 2 Drawing Sheets

(51) Int. Cl.
*C08G 61/12* (2006.01)
*C09K 11/06* (2006.01)
*H05B 33/14* (2006.01)
*H01L 51/50* (2006.01)

(52) U.S. Cl.
CPC .............. *C08G61/123* (2013.01); *C09K 11/06* (2013.01); *H01L 51/0039* (2013.01); *H05B 33/14* (2013.01); *C08G 2261/141* (2013.01); *C08G 2261/143* (2013.01); *C08G 2261/148* (2013.01); *C08G 2261/149* (2013.01); *C08G 2261/3142* (2013.01); *C08G 2261/411* (2013.01); *C08G 2261/5222* (2013.01); *C08G 2261/95* (2013.01); *C09K 2211/1416* (2013.01); *C09K 2211/1466* (2013.01); *H01L 51/0085* (2013.01); *H01L 51/5072* (2013.01); *Y02E 10/549* (2013.01)

(56) References Cited

U.S. PATENT DOCUMENTS

| | | | |
|---|---|---|---|
| 7,368,616 B2* | 5/2008 | Wallace | C07F 5/025 528/394 |
| 7,494,720 B2 | 2/2009 | Burroughes et al. | |
| 7,754,841 B2* | 7/2010 | O'Dell | C07C 17/12 257/40 |
| 8,343,381 B1* | 1/2013 | Chesterfield | 252/500 |
| 2004/0135131 A1* | 7/2004 | Treacher et al. | 252/582 |
| 2005/0158583 A1* | 7/2005 | Kim et al. | 428/690 |
| 2006/0046092 A1* | 3/2006 | Towns | C07C 13/70 428/690 |
| 2006/0058494 A1* | 3/2006 | Busing et al. | 528/86 |
| 2006/0063033 A1* | 3/2006 | Sohn et al. | 428/690 |
| 2006/0149016 A1 | 7/2006 | O'Dell et al. | |
| 2007/0009761 A1* | 1/2007 | Goto et al. | 428/690 |
| 2009/0153021 A1* | 6/2009 | Jen et al. | 313/498 |
| 2009/0167170 A1 | 7/2009 | Burroughes et al. | |
| 2009/0184292 A1 | 7/2009 | Ohuchi et al. | |
| 2009/0184635 A1* | 7/2009 | Pan et al. | 313/504 |
| 2010/0084965 A1 | 4/2010 | Nakatani et al. | |
| 2010/0171100 A1 | 7/2010 | Nakatani et al. | |
| 2011/0210322 A1 | 9/2011 | Ishii et al. | |

FOREIGN PATENT DOCUMENTS

| | | |
|---|---|---|
| CN | 101092475 A | 12/2007 |
| JP | 2005-239789 A | 9/2005 |
| JP | 2006-505647 A | 2/2006 |
| JP | 2006-056821 A | 3/2006 |
| JP | 2006-269472 A | 10/2006 |
| JP | 2007-031704 A | 2/2007 |
| JP | 2007-031705 A | 2/2007 |
| JP | 2008-007762 A | 1/2008 |
| JP | 2009-097016 A | 5/2009 |
| WO | WO-02/077060 A1 | 10/2002 |
| WO | WO-2010/041559 A1 | 4/2010 |

OTHER PUBLICATIONS

Wu et al. "Novel Oxadiazole-Containing Polyfluorene with Efficient Blue Electroluminescence" Chem. Mater. 2003, 15, 269-274.*
Liu et al. Facile Synthesis of Spirocyclic Aromatic Hydrocarbon Derivatives Based on o-Halobiaryl Route and Domino Reaction for Deep-Blue Organic Semiconductors, Org. Lett. 2009, 11(17), 3850-3853.*
Zhu et al. "Di-Channel Polyfluorene Containing Spiro-Bridged Oxadiazole Branches" Macromol. Rapid Commun. 2005, 26, 1729-1735.*
Chinese Office Action dated Aug. 25, 2014 for Chinese Patent Application No. 201180041226.0.
International Search Report for PCT/EP2011/003430 mailed Mar. 19, 2012.

* cited by examiner

| | | |
|---|---|---|
| 3 nm / 150 nm | Cathode | Ba/Al |
| 80 nm | EM | P1, P2, P3 or V1 + T1 |
| 20 nm | IL | HIL-012 |
| 80 nm | Buffer | PEDOT |
| | ITO | |

POLYMERS CONTAINING STRUCTURAL UNITS WHICH HAVE ELECTRON-TRANSPORT PROPERTIES

CROSS-REFERENCE TO RELATED APPLICATIONS

This application is a national stage application (under 35 U.S.C. §371) of PCT/EP2011/003430, filed Jul. 8, 2011, which claims benefit of German Application 10 2010 033 080.9, filed Aug. 2, 2010.

BACKGROUND OF THE INVENTION

The present invention relates to a polymer which contains at least one structural unit which has electron-transport properties, to processes for the preparation thereof, to mixtures (blends), solutions and formulations which comprise these polymers. Furthermore, the present invention relates to the use of these polymers in electronic devices, in particular in organic electro-luminescent devices, so-called OLEDs (OLED=organic light emitting diodes), and to these organic electroluminescent devices themselves. The polymers according to the invention exhibit improved efficiency and a long lifetime, in particular on use in OLEDs.

Polymers for opto-electronic applications are preferably either conjugated or partially conjugated main-chain polymers, in which the polymer back-bone itself plays an important role with respect to the opto-electronic properties, side-chain polymers, whose functionality is brought about by transport units and/or emitters which is chemically bonded to the backbone, or neutral polymers, which are responsible only for the film-forming properties (known of organic photoreceptors, in which the hole-transport materials are typically dissolved in polycarbonate).

Polymers have already been investigated intensively for a long time as highly promising materials in OLEDs. OLEDs which comprise polymers as organic materials are frequently also known as PLEDs (PLED=polymeric light emitting diodes). Their simple preparation promises inexpensive production of corresponding light-emitting devices.

Since PLEDs usually only consist of one light-emitting layer, polymers are required which are able as far as possible to combine all functions (charge injection, charge transport, recombination) of an OLED in themselves. In order to meet these requirements, different monomers which take on the corresponding functions are employed during the polymerisation. Thus, it is generally necessary, for the generation of all three emission colours, to copolymerise certain comonomers into the corresponding polymers (cf., for example, WO 00/46321 A1, WO 03/020790 A2 and WO 02/077060 A1). Thus, it is possible, for example starting from a blue-emitting base polymer ("backbone"), to generate the other two primary colours red and green.

Various classes of material, such as, for example, poly-para-phenylenes (PPPs), have already been proposed or developed as polymers for full-colour display elements (full-colour displays). Thus, for example, polyfluorene, polyspiro-bifluorene, polyphenanthrene, polydihydrophenanthrene and polyindenofluorene derivatives come into consideration. Polymers which contain a combination of the said structural elements have also already been proposed.

The most important criteria of an OLED are efficiency, colour and lifetime. These properties are determined not only by the emitter(s) used, but also are crucially dependent on how well the charge transport in the OLED can take place. It is known that both electron transport and also hole transport in a PLED take place in the layer of the light-emitting polymer (LEP layer). In order to improve the efficiency and lifetime of OLEDS, it is necessary to simplify the injection or transport of the charges into the LEP layer. In order to improve so-called hole injection or hole transport, a number of novel monomers based on triarylamine derivatives have been proposed. These have enabled the efficiency and lifetime of such devices to be improved. However, virtually no stable electron-transport units are described in the literature. For this reason, predominantly improvements in the electron-transport units compared with the materials known from the prior art are required.

Since PLEDs are usually composed of only one layer, the units which facilitate charge transport must be incorporated directly into the polymer through polymerisable monomers. Thus, oxadiazole, which is known as electron-transport unit, has already been incorporated into conjugated and non-conjugated polymers as main-chain component and side-chain component. The efficiency of devices comprising such polymers was fairly satisfactory, but the lifetime was inadequate for use in OLEDs. Likewise, compounds containing a plurality of keto groups have also been used. However, corresponding polymers have the disadvantage that, owing to the energy gap of such molecules, they are not compatible with units which emit in the blue spectral region.

It was accordingly an object of the present invention to provide a polymer which contains at least one recurring unit which has electron-transport properties, thus simplifies electron transport in electronic devices, preferably PLEDs, and thereby increases their efficiency.

The object according to the invention has been achieved in accordance with the invention by the provision of a polymer which contains at least one structural unit of the following formula (I):

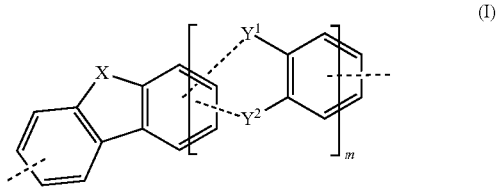

(I)

where the symbols and indices used have the following meaning:

X is selected from $C(R^1)_2$, $NR^1$, $C(R^1)_2$—$C(R^1)_2$, $CR^1$=$CR^1$ and

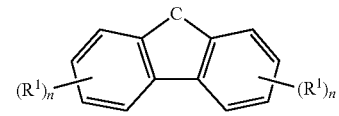

$Y^1$ and $Y^2$ are each selected, independently of one another, from $C(R^1)_2$, $NR^1$, $C(R^1)_2$—$C(R^1)_2$, $CR^1$=$CR^1$ and a single bond, but with the proviso that either $Y^1$ or $Y^2$ is a single bond, m is 0 or 1, $R^1$ is in each case selected, independently of one another, from H, D, F, Cl, Br, I, $N(Ar^1)_2$, $C(=O)Ar^1$, $P(=O)Ar^1_2$, $S(=O)Ar^1$, $S(=O)_2Ar^1$, $CR^2$=$CR^2Ar^1$, CN, $NO_2$, $Si(R^2)_3$, $B(OR^2)_2$, $OSO_2R^2$, a straight-chain alkyl, alkoxy or thioalkoxy group having 1 to 40 C atoms, a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C≡C$, $Si(R^2)_2$, $Ge(R^2)_2$, $Sn(R^2)_2$, $C=O$, $C=S$, $C=Se$, $C=NR^2$, $P(=O)(R^2)$, $SO$, $SO_2$, $NR^2$, $O$, $S$ or $CONR^2$ and where one or more H atoms may be replaced by F, Cl, Br, I, CN or $NO_2$, an aryl, aryloxy, heteroaryl or heteroaryloxy group having 5 to 40 C atoms, which may also be substituted by one or more non-aromatic radicals $R^1$, where, in addition, two or more radicals, preferably two adjacent radicals, $R^1$ may form an aliphatic or aromatic, mono- or polycyclic ring system with one another, or an electron-transport unit $R^3$, but with the proviso that at least one of the radicals $R^1$ is an electron-transport unit $R^3$, $Ar^1$ is selected on each occurrence, in each case independently of one another, from an aryl or heteroaryl group or an aromatic or heteroaromatic ring system, $R^2$ is in each case, independently of one another, H, an aliphatic hydrocarbon radical having 1 to 20 C atoms or an aromatic hydrocarbon radical having 6 to 20 C atoms, where two or more radicals $R^2$ may also form a ring system with one another, $R^3$ is an electron-transport unit, n is in each case, independently of one another, 1, 2, 3 or 4, and where the dashed lines on the two outer phenyl rings represent the bonds to the adjacent structural units in the polymer.

A BRIEF DESCRIPTION OF THE FIGURES

A DETAILED DESCRIPTION OF THE INVENTION

Figures 1, 2:
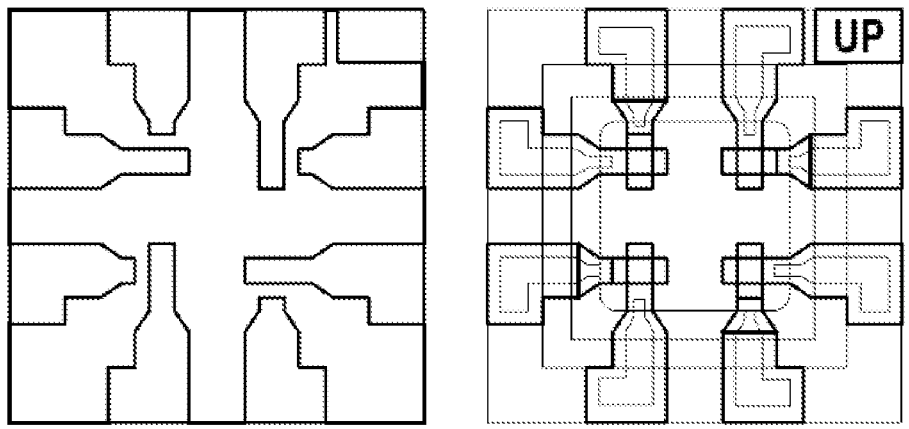
FIG. 1 illustrates a structure of a typical device.
FIG. 2 illustrates on the left of the diagram, ITO structure applied to the glass support and on the right of the diagram, a complete electronic structure with ITO, vapour-depicted cathode and optional metallization of the leads.

The dashed lines in the structural unit of the formula (I) which connect $Y^1$ and $Y^2$ to the central phenyl ring mean that the linking of the unit in square brackets can take place in three different ways, namely in accordance with formula (II) (IIIa) or (IIIb):

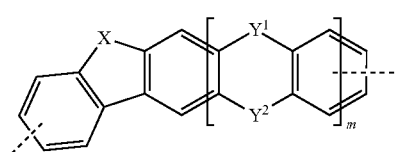
(II)

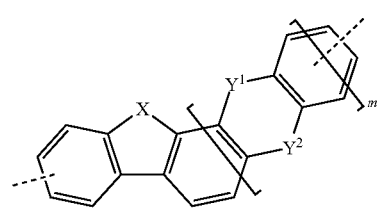
(IIIa)

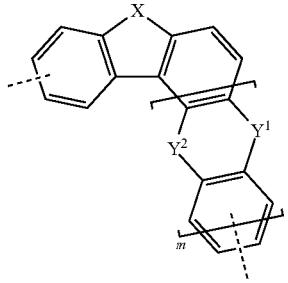
(IIIb)

The aromatic ring system in the sense of the present invention preferably contains 6 to 60 C atoms in the ring system. The heteroaromatic ring system in the sense of the present invention contains 2 to 60 C atoms and at least one heteroatom in the ring system, with the proviso that the sum of C atoms and heteroatoms is at least 5. The heteroatoms are preferably selected from Si, N, P, O, S and/or Se, particularly preferably selected from N, P, O and/or S. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, a C ($sp^3$-hybridised), N or O atom. Thus, for example, systems such as 9,9'-spirobifluorene, 9,9-diarylfluorene, triarylamine, diaryl ethers, stilbene, etc., are also intended to be taken to be aromatic ring systems in the sense of the present invention, as are systems in which two or more aryl groups are interrupted, for example, by a linear or cyclic alkyl group or by a silyl group. $P=O$ or $C=O$ groups are usually not conjugation-interrupting.

An aromatic or heteroaromatic ring system having 5 to 60 ring atoms, which may also in each case be substituted by any desired radicals R and linked to the aromatic or heteroaromatic ring system via any desired positions, is taken to mean, in particular, groups derived from phenyl, naphthyl, anthracene, phenanthrene, pyrene, chrysene, perylene, fluoranthene, naphthacene, tetracene, pentacene, benzopyrene, biphenyl, biphenylene, binaphthyl, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene.

The aromatic or heteroaromatic ring system is particularly preferably phenyl, biphenyl, triphenyl, naphthyl, anthracene, binaphthyl, phenanthrene, dihydrophenanthrene, pyrene, dihydropyrene, chrysene, perylene, tetracene, benzopyrene and fluorene.

An aryl group in the sense of the present invention contains 6 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from Si, N, P, O, S and/or Se; particularly preferably selected from N, P, O or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole.

In the present invention, the term "aliphatic hydrocarbon radical having 1 to 20 carbon atoms" is taken to mean a saturated or unsaturated, non-aromatic hydrocarbon radical, which may be linear, branched or cyclic (alkyl group). One or more carbon atoms may be replaced by O (alkoxy group), N or S (thioalkoxy group). In addition, one or more hydrogen atoms may be replaced by fluorine. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, octynyl, methoxy, trifluoromethoxy, ethoxy, n-propoxy, i-propoxy, n-butoxy, i-butoxy, s-butoxy, t-butoxy and 2-methylbutoxy, where methyl, ethyl, i-propyl and i-butyl are particularly preferred.

In the case where two radicals $R^2$ can form a ring system, these two linked radicals $R^2$ preferably represent a divalent aliphatic group having 2 to 8 carbon atoms. Examples thereof are compounds of the following formula —$CH_2(CH_2)_m$ $CH_2$—, where m=0, 1, 2, 3, 4, 5 or 6, preferably 0, 1, 2 or 3.

The term "electron-transport unit" in the present application is taken to mean a unit which is capable of abstracting an electron from the environment and releasing it back to the environment.

The electron-transport unit $R^3$ is preferably a unit which is selected from the group consisting of benzimidazoles, triazines, pyrimidines, pyrazines, pyridazines, phenanthrolines, ketones, phosphine oxides and derivatives thereof. The backbones mentioned may be substituted by one or more radicals $R^1$ or unsubstituted here. $R^3$ is particularly preferably a benzimidazole, a triazine, a derivative thereof or a ketone. $R^3$ is very particularly preferably an N-phenylbenzimidazole or a 3,5-diphenyltriazine.

Surprisingly, it has been found that the polymers according to the invention which contain at least one structural unit of the formula (I) have very good properties. In particular, they exhibit very high efficiencies compared with reference systems to date. The polymers according to the invention are particularly suitable as electron conductors.

In the present application, the term polymer is taken to mean both polymeric compounds, oligomeric compounds, and dendrimers. The polymeric compounds according to the invention preferably have 10 to 10,000, particularly preferably 20 to 5000 and in particular 50 to 2000 structural units. The oligomeric compounds according to the invention preferably have 2 to 9 structural units. The branching factor of the polymers here is between 0 (linear polymer, no branching points) and 1 (fully branched dendrimer).

The polymers according to the invention are either conjugated, partially conjugated or non-conjugated polymers. Conjugated or partially conjugated polymers are preferred.

The structural units of the formula (I) can, in accordance with the invention, be incorporated into the main chain or into the side chain of the polymer, preferably into the main chain.

"Conjugated polymers" in the sense of the present application are polymers which contain principally $sp^2$-hybridised (or optionally also sp-hybridised) carbon atoms in the main chain, which may also be replaced by corresponding heteroatoms. In the simplest case, this means the alternating presence of double and single bonds in the main chain, but also polymers containing units such as, for example, meta-linked phenylene are intended to be regarded as conjugated polymers in the sense of this application. "Principally" means that naturally (involuntarily) occurring defects which result in conjugation interruptions do not devalue the term "conjugated polymer". Furthermore, the term conjugated is likewise used in this application if, for example, arylamine units, arylphosphine units, certain heterocycles (i.e. conjugation via N, O or S atoms) and/or organometallic complexes (i.e. conjugation via the metal atom) are located in the main chain. An analogous situation applies to conjugated dendrimers. By contrast, units such as, for example, alkyl bridges ($sp^3$-hybridised carbon atoms), (thio)ether, ester, amide or imide links are clearly defined as non-conjugated segments. A partially conjugated polymer in the sense of the present application is intended to be taken to mean a polymer which contains conjugated regions which are separated from one another by non-conjugated sections, specific conjugation interrupters (for example spacer groups) or branches, for example in which relatively long conjugated sections in the main chain are interrupted by non-conjugated sections, or which contains relatively long conjugated sections in the side chains of a polymer which is non-conjugated in the main chain. Conjugated and partially conjugated polymers may also include conjugated, partially conjugated or other dendrimers.

The term "dendrimer" in the present application is intended to be taken to mean a highly branched compound built up from a multifunctional centre (core) to which branched monomers are bonded in a regular structure, giving a tree-like structure. Both the centre and the monomers here may adopt any desired branched structures which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

In a further preferred embodiment of the present invention, units of the formula (I) are conjugated with the main polymer chain. This can be achieved on the one hand by these units being incorporated into the main chain of the polymer in such a way that the conjugation of the polymer, as described above, is thereby retained. On the other hand, these units can also be linked into the side chain of the polymer in such a way that conjugation with the main chain of the polymer exists. This is the case, for example, if the linking to the main chain takes place only via $sp^2$-hybridised (or optionally also via sp-hybridised) carbon atoms, which may also be replaced by corresponding heteroatoms. However, if the linking takes place through units such as, for example, simple (thio)ether bridges, esters, amides or alkylene chains, the units of the formula (I) are defined as non-conjugated with the main chain.

Preferred structural units of the formula (I) are structural units (Ia) to (Iq) depicted below:
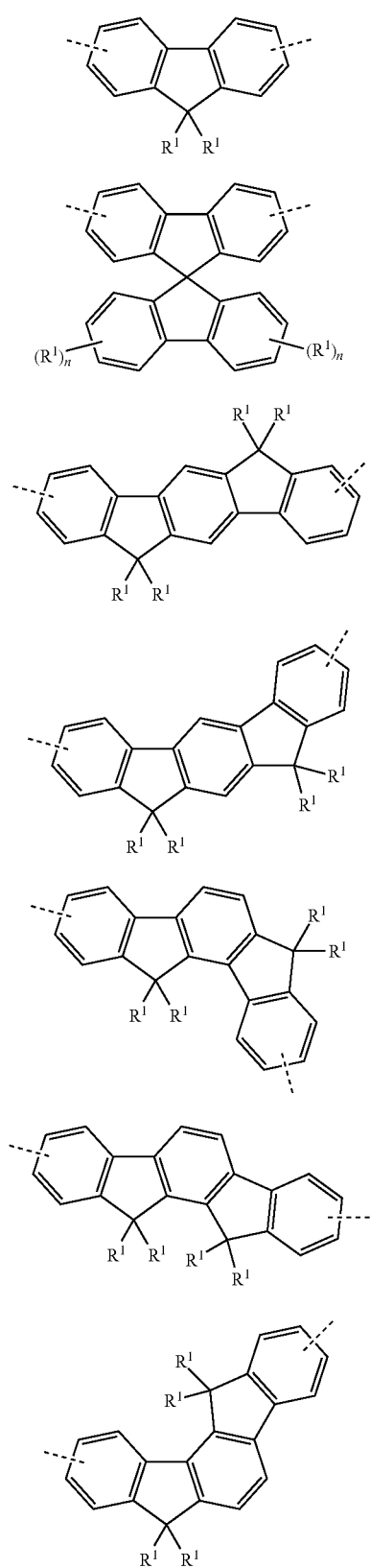
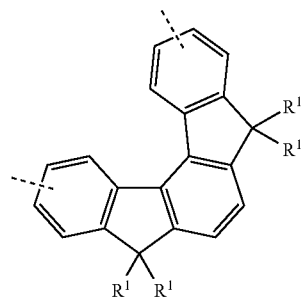
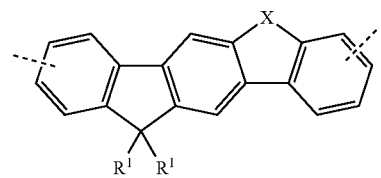
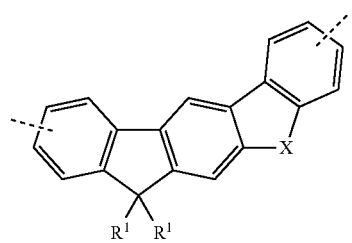
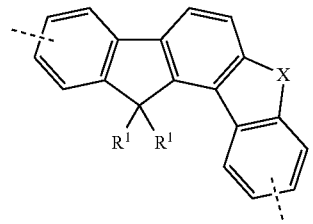
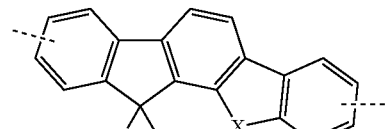
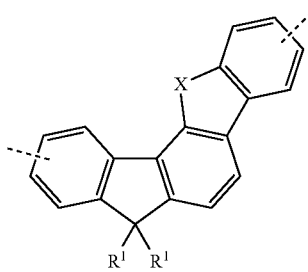

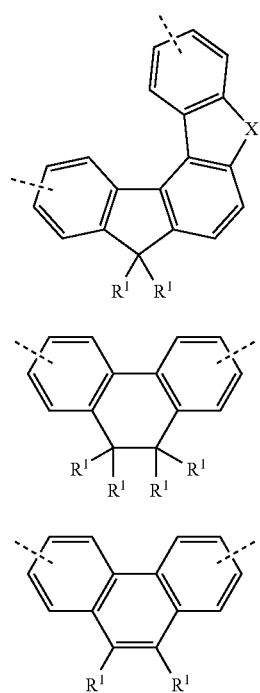 (Io)
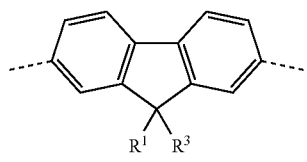 (Ip)
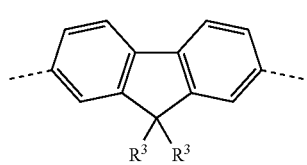 (Iq)
Particularly preferred structural units of the formula (I) are structural units (Ia1) to (Iq2) depicted below:
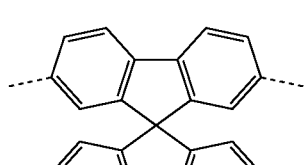 (Ia1)
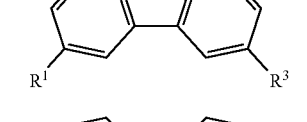 (Ia2)
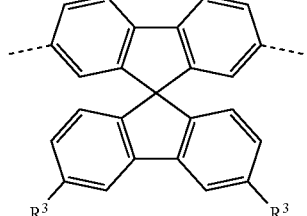 (Ib1)
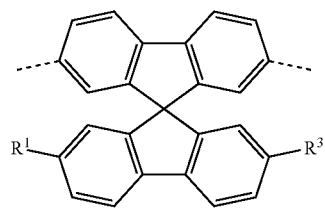 (Ib3)
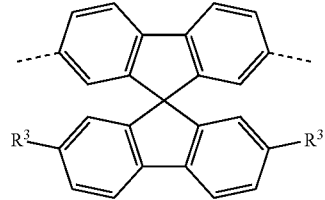 (Ib4)
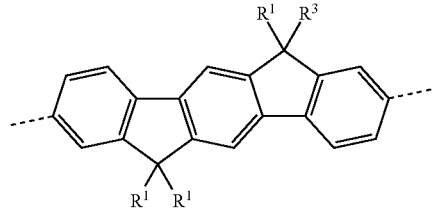 (Ic1)
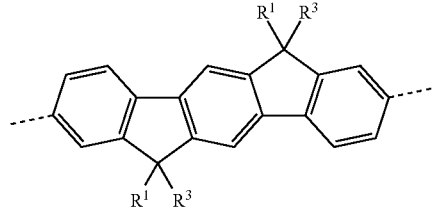 (Ic2)
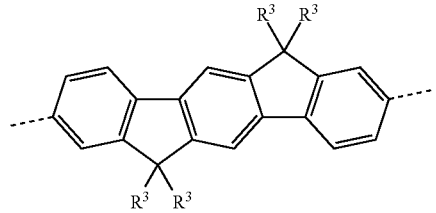 (Ic3)
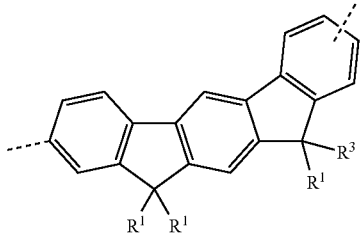 (Id1)
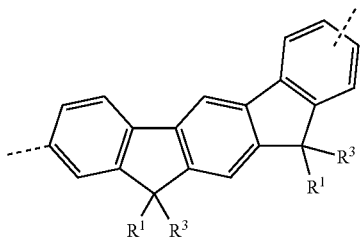 (Id2)

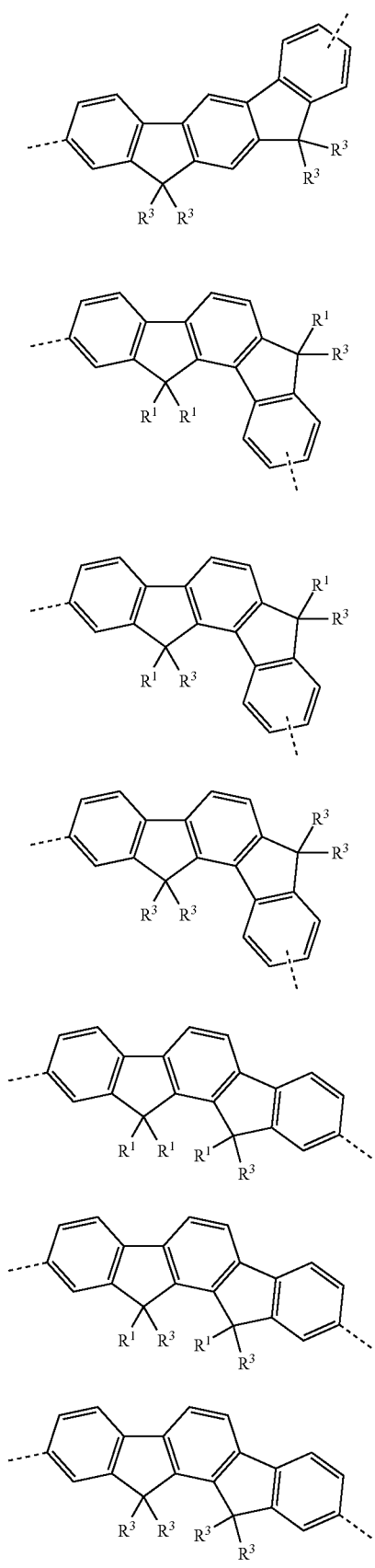
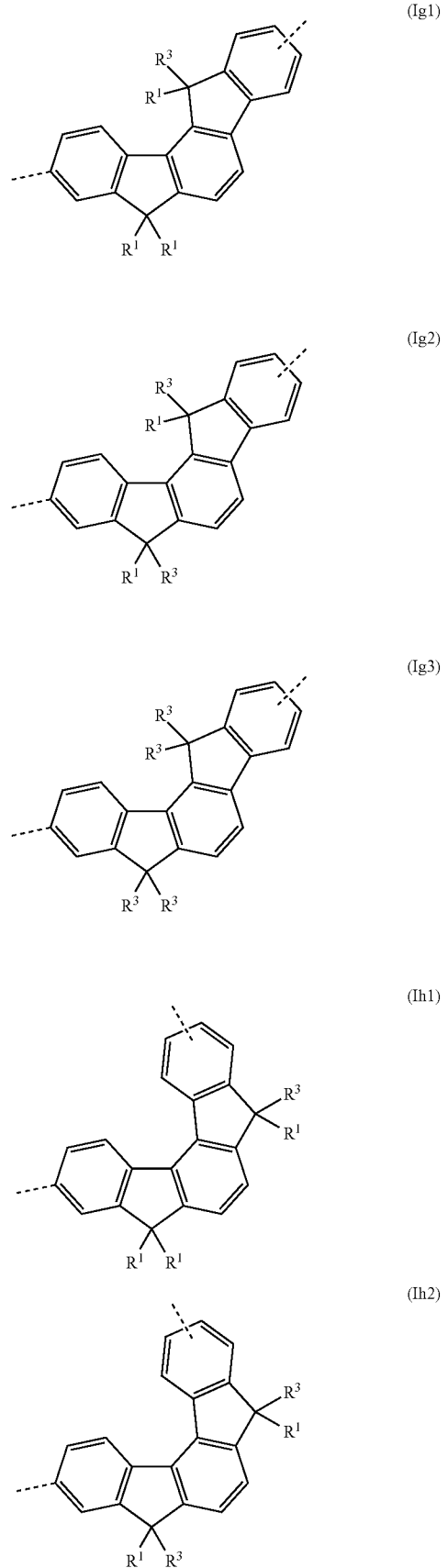

-continued
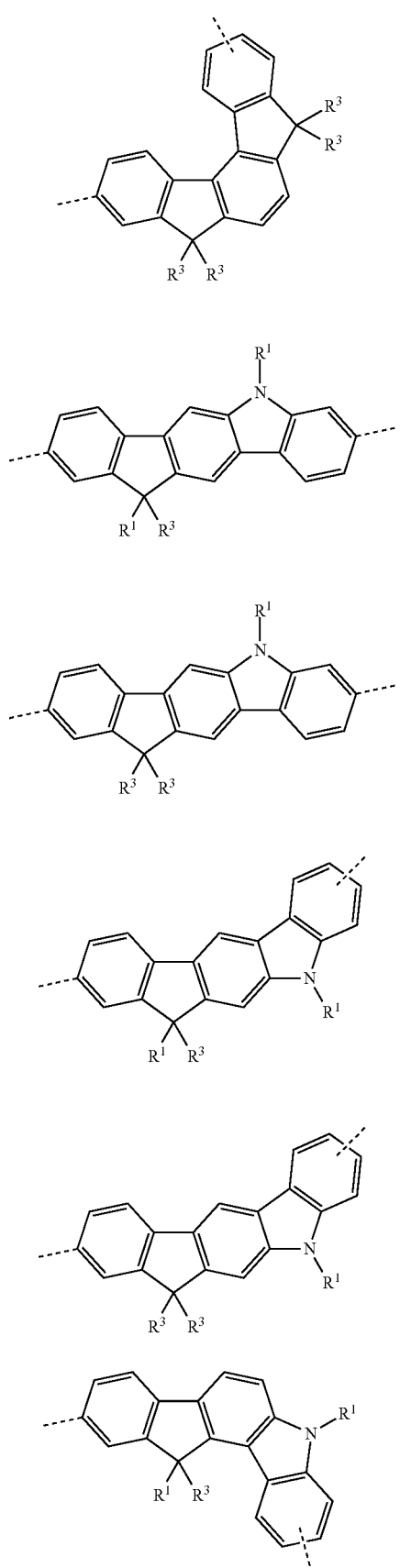
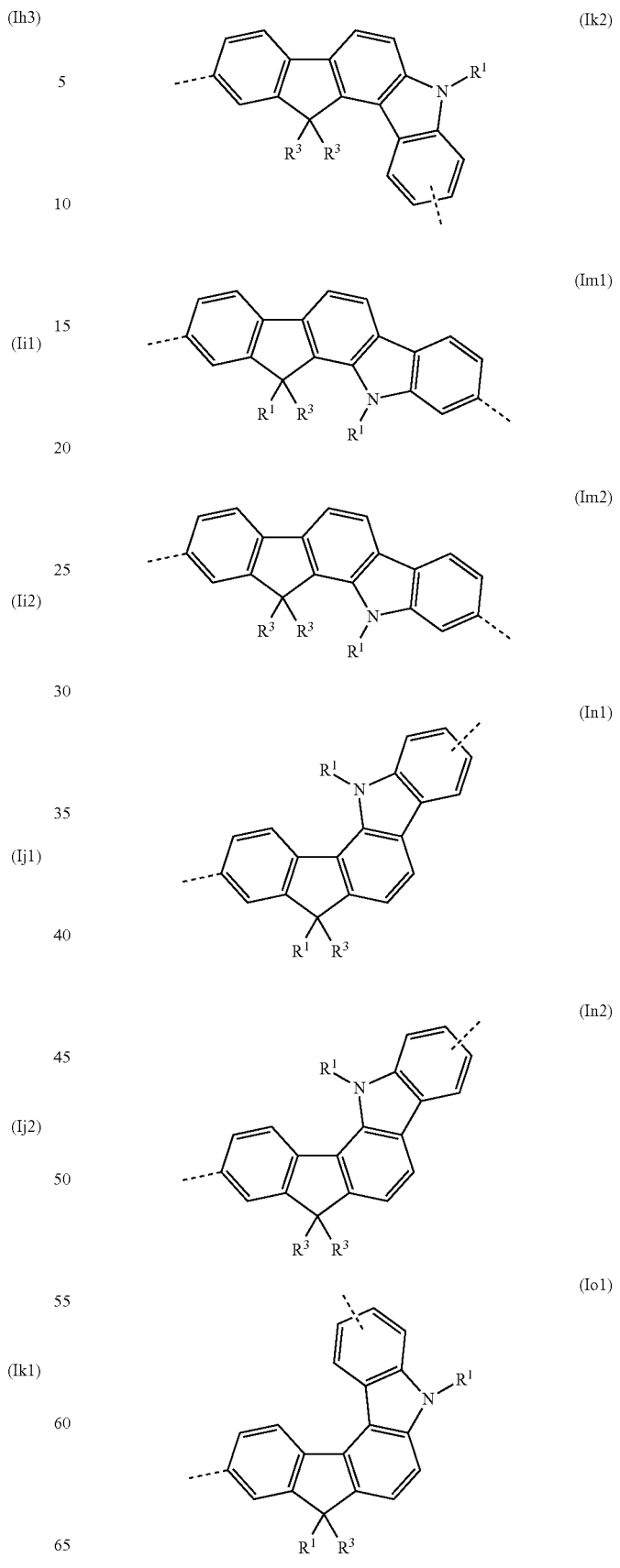

-continued

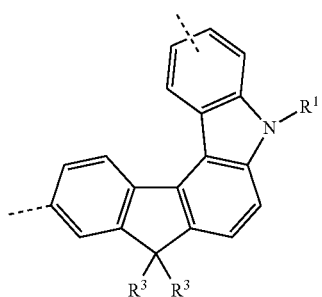 (Io2)

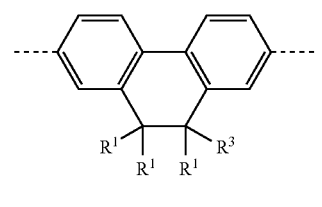 (Ip1)

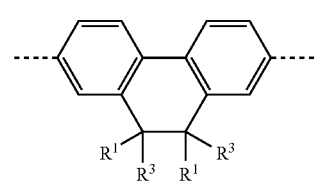 (Ip2)

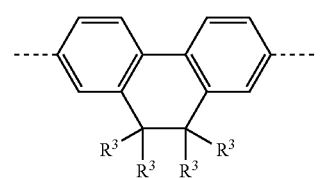 (Ip3)

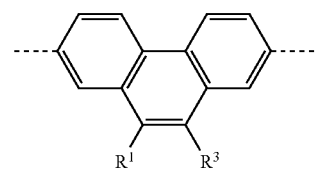 (Iq1)

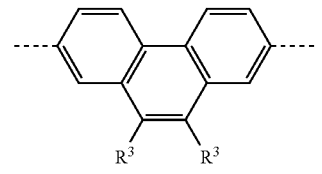 (Iq2)

Particularly preferred structural units of the formula (I) are the structural units of the formulae (Ia) to (Im) depicted as preferred above or the structural units of the formulae (Ia1) to (Im2) depicted as particularly preferred above in which $R^1$ denotes hydrogen and $R^3$ is selected from the following structural units (IV) to (VII):

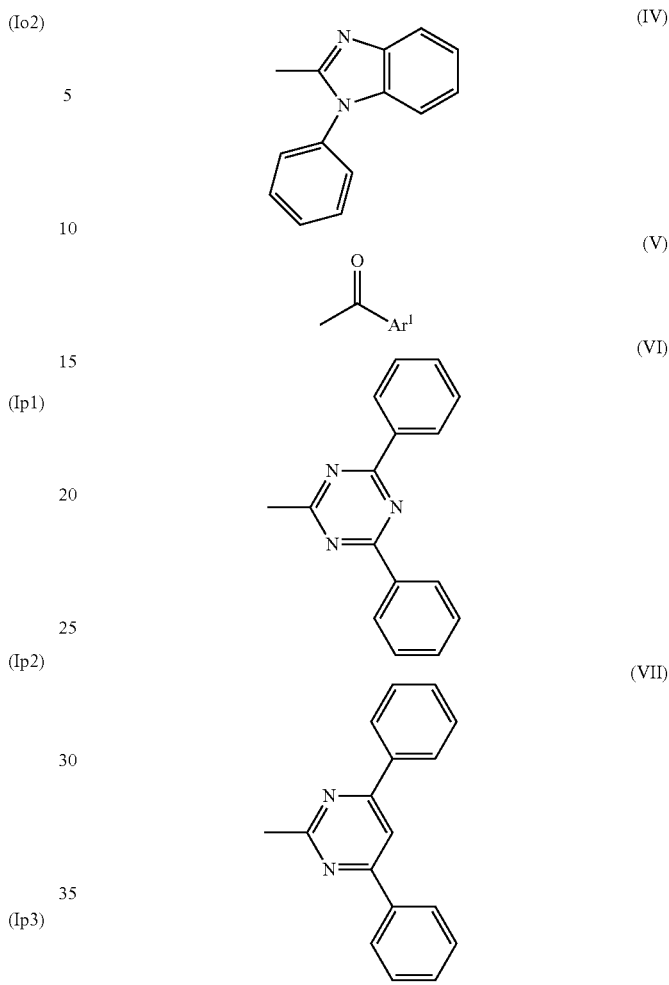

where $Ar^1$ in formula (V) can adopt the meanings indicated in relation to the formula (I).

In a further embodiment of the present invention, the polymer according to the invention contains not only a structural unit of the formula (I), but may also contain combinations of different compounds of the formula (I), i.e. the polymer can be obtained by copolymerisation of a plurality of structural units of the formula (I).

Besides the structural units of the formula (I), the polymer according to the invention preferably also contains further structural units which are different from those of the formula (I).

In the polymer according to the invention, the proportion of the units of the formula (I) is 0.01 to 100 mol %, preferably 0.1 to 80 mol %, particularly preferably 1 to 70 mol % and in particular 5 to 60 mol %, based on the total number of recurring units of the dendrimer, oligomer or polymer.

Besides one or more structural units of the formula (I), the polymers according to the invention may also contain further structural units. These are, inter alia, those as disclosed and listed extensively in WO 02/077060 A1 and in WO 2005/014689 A2. These are incorporated into the present invention by way of reference. The further structural units can originate, for example, from the following classes:

group 1: units which influence the hole-injection and/or hole-transport properties of the polymers;

group 2: units which influence the electron-injection and/or electron-transport properties of the polymers;

group 3: units which have combinations of individual units from group 1 and group 2;

group 4: units which modify the emission characteristics to such an extent that electrophosphorescence can be obtained instead of electrofluorescence;

group 5: units which improve the transfer from the so-called singlet state to the triplet state;

group 6: units which influence the emission colour of the resultant polymers;

group 7: units which are typically used as backbone;

group 8: units which influence the film morphology and/or the rheology of the resultant polymers.

Preferred polymers according to the invention are those in which at least one structural unit has hole-transport properties, i.e. which contain units from group 1.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan units and derivatives thereof and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine units and derivatives thereof, but also triarylboranes and further O-, S- or N-containing heterocycles having a low LUMO (LUMO=lowest unoccupied molecular orbital). These units in the polymer preferably result in an LUMO of less than −12.5 eV (against vacuum level), particularly preferably less than −2.0 eV.

It may be preferred for the polymers according to the invention to contain units from group 3 containing structures which increase the hole mobility and structures which increase the electron mobility (i.e. units from group 1 and 2) bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from group 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve the transfer from the singlet state to the triplet state and which, employed in support of the structural units from group 3, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silanes and derivatives thereof and similar compounds, as described, for example, in WO 2005/040302 A1.

Structural units from group 6, besides those mentioned above, are those which have at least one further aromatic structure or another conjugated structure which do not fall under the above-mentioned groups, i.e. which have only little influence on the charge-carrier mobilities, which are not organometallic complexes or which do not influence the singlet-triplet transfer. Structural elements of this type can influence the emission colour of the resultant polymers. Depending on the unit, they can therefore also be employed as emitters. Preference is given here to aromatic structures having 6 to 40 C atoms or also tolan, stilbene or bisstyrylarylene units and derivatives thereof, each of which may be substituted by one or more radicals R. Particular preference is given here to the incorporation of 1,4 phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''terphenylylene, 4,4'-bi-1,1'-naphthylylene, 4,4'-tolanylene, 4,4'-stilbenylene, 4,4''bisstyrylarylene, benzothiadiazole units and derivatives thereof and corresponding oxygen derivatives, quinoxaline, phenothiazine, phenoxazine, dihydrophenazine, bis(thiophenyl)arylene, oligo(thiophenylene), phenazine, rubrene, pentacene or perylene units and derivatives thereof, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene, 4,5,9,10-tetrahydropyrene, fluorene, 9,9'spirobifluorene, phenanthrene, 9,10-dihydrophenanthrene, 5,7-dihydrodibenzoxepine and cis- and trans-indenofluorene units and derivatives thereof.

Structural units from group 8 are those which influence the film morphology and/or the rheology of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which, besides one or more of the structural units of the formula (I), simultaneously additionally contain one or more units selected from groups 1 to 8 which are different from the structural units according to the invention. It may likewise be preferred for more than one structural unit from one group to be present simultaneously.

Preference is given here to polymers according to the invention which, besides one or more of the structural units of the formula (I), also contain units from group 7, particularly preferably at least 50 mol % of these units, based on the total number of structural units in the polymer.

It is likewise preferred for the polymers according to the invention to contain units which improve charge transport and/or charge injection, i.e. units from group 1 and/or 2; a proportion of 0.5 to 30 mol % of these units is particularly preferred; a proportion of 1 to 10 mol % of these units is very particularly preferred.

It is furthermore particularly preferred for the polymers according to the invention to contain structural units from group 7 and units from group 1 and/or 2, in particular at least 50 mol % of units from group 7 and 0.5 to 30 mol % of units from group 1.

The polymers according to the invention are either homopolymers containing structural units of the formula (I)

or copolymers. The polymers according to the invention can be linear, branched or crosslinked. Besides one or more structural units of the formula (I), copolymers according to the invention may potentially have one or more further structural units from groups 1 to 8 mentioned above.

The copolymers according to the invention may have random, alternating or block-like structures or have a plurality of these structures in an alternating arrangement. The way in which copolymers having block-like structures can be obtained and which further structural elements are particularly preferred for this purpose is described in detail, for example, in WO 2005/014688 A2. The latter is incorporated into the present application by way of reference. It should likewise again be emphasised at this point that the polymer may also have dendritic structures.

The polymers according to the invention have advantageous properties, in particular long lifetimes, high efficiencies and good colour coordinates.

The polymers according to the invention are generally prepared by polymerisation of one or more monomers, of which at least one monomer results in structural units of the formula (I) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of the SUZUKI coupling, the YAMAMOTO coupling and the STILLE coupling; the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

The synthesis of the units from group 1 to 8 described above and the further emitting units is known to the person skilled in the art and is described in the literature, for example in WO 2005/014689 A2, WO 2005/030827 A1 and WO 2005/030828 A1. These documents and the literature cited therein are incorporated into the present application by way of reference.

For the synthesis of the polymers according to the invention, the corresponding monomers are required. Monomers which result in structural units of the formula (I) in the polymers according to the invention are compounds which are correspondingly substituted and have in two positions suitable functionalities which allow this monomer unit to be incorporated into the polymer. These monomers are novel and are therefore likewise a subject-matter of the present invention.

Accordingly, the present invention also relates to compounds of the following formula (VIII):

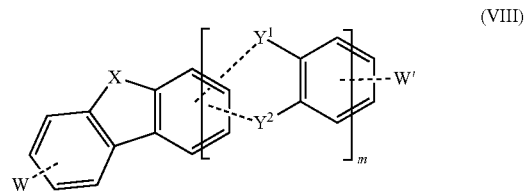

(VIII)

where the symbols used have the following meaning:

W and W' are selected, independently of one another, from the group consisting of halogen, O-tosylate, O-triflate, O—SO$_2$R$^4$, B(OR$^4$)$_2$ and Sn(R$^4$)$_3$, where R$^4$ is selected on each occurrence, independently of one another, from the group consisting of H, an aliphatic hydrocarbon radical having 1 to 20 C atoms and an aromatic hydrocarbon radical having 6 to 20 ring atoms, and where two or more radicals R$^4$ may also form an aliphatic ring system with one another; and where X, Y$^1$, Y$^2$ and m have the same meanings as in the structural units of the formula (I). The embodiments of the structural units of the formula (I) which are preferred and particularly preferred in the present invention are also embodiments of the compounds of the formula (VIII) which are preferred and particularly preferred in accordance with the invention.

In a particularly preferred embodiment, W and W' are selected, independently of one another, from Br, I and B(OR$^2$)$_2$. Br is very particularly preferred.

In the present invention, halogen is taken to mean fluorine, chlorine, bromine or iodine, where chlorine, bromine and iodine are preferred, and bromine and iodine are particularly preferred.

In the present invention, the term "aromatic hydrocarbon radical having 5 to 20 ring atoms" is taken to mean an aromatic ring system having 6 to 20 carbon atoms or a heteroaromatic ring system having 5 to 20 ring atoms, where one or more of the ring atoms are intended to be a heteroatom selected from N, O or S and the others are carbon atoms. For the purposes of the present invention, these definitions are also intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, C (sp$^3$-hybridised), N, O, Si, P, S, Ge (e.g.: CR$_2$, C=O, NR, O, SiR$_2$, P=O, S and GeR$_2$, where R is selected from the group consisting of H, a C$_{1-40}$-alkyl group, a C$_{2-40}$-alkenyl group, a C$_{2-40}$-alkynyl group, an optionally substituted C$_{6-40}$-aryl group and an optionally substituted 5- to 25-membered heteroaryl group). In addition, they may also be monocyclic or polycyclic, i.e. they may have one ring (for example phenyl) or two or more rings, which may also be condensed (for example naphthyl) or covalently linked (for example biphenyl), or contain a combination of condensed and linked rings. Fully conjugated aryl groups are preferred.

It may additionally be preferred to use the polymers according to the invention not as the pure substance, but instead as a mixture (also called a blend) together with further polymeric, oligomeric, dendritic or low-molecular-weight substances of any desired type. These may, for example, improve the electronic properties or themselves emit.

The present invention thus furthermore relates to a polymer mixture which comprises one or more polymers according to the invention, and one or more further polymeric, oligomeric, dendritic or low-molecular-weight substances.

In a further embodiment of the present invention, it is preferred for a mixture to comprise a polymer according to the invention and a low-molecular-weight substance. The low-molecular-weight substance is preferably a triplet emitter.

In a further embodiment, it is preferred for the polymer which contains structural units of the formula (I) to be employed in an emitting layer together with an emitting compound. In this case, the polymer is preferably employed in combination with one or more phosphorescent materials (triplet emitters). For the purposes of the present application, phosphorescence is taken to mean the luminescence from an excited state of relatively high spin multiplicity, i.e. a spin state >1, in particular from an excited triplet state or from an MLCT mixed state. The mixture comprising the polymer according to the invention or the preferred embodiment mentioned above and the emitting compound then comprises between 99 and 1% by weight, preferably between 98 and 60% by weight, particularly preferably between 97 and 70% by weight, in particular between 95 and 75% by weight, of the polymer according to the invention or of the preferred embodiment mentioned above, based on the entire mixture comprising emitter and matrix material. Correspondingly, the mixture comprises up to 99% by weight, preferably up to 40% by weight, particularly preferably up to 30% by weight and in particular up to 25% by weight, of the emitter, based on the entire mixture comprising emitter and matrix material.

In addition, the mixture in the case of green triplet emitters comprises at least 1% by weight, preferably at least 2% by weight, particularly preferably at least 3% by weight and in particular at least 5% by weight, of the emitter, based on the entire mixture comprising emitter and matrix material.

In the above-mentioned embodiment in which the polymer which contains structural units of the formula (I) is employed in an emitting layer together with an emitting compound, the proportion of the emitting compound may, however, also be significantly lower.

In particular in the case of red triplet emitters, the mixture preferably comprises at least 0.01% by weight of the emitter, based on the entire mixture, but preferably less than 6% by weight of the emitter, based on the entire mixture.

Suitable phosphorescent compounds are, in particular, compounds which emit light, preferably in the visible region, on suitable excitation and in addition contain at least one atom having an atomic number of greater than 36 and less than 84, particularly preferably greater than 56 and less than 80.

Examples of the emitters described above are revealed by the applications WO 00/70655, WO 01/41512, WO 02/02714, WO 02/15645, EP 1191613, EP 1191612, EP 1191614, WO 05/033244 and DE 102008015526. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without an inventive step.

For the purposes of the present application, the emitter compound in the composition according to the invention is preferably a green-emitting triplet emitter. The triplet emitter may likewise be a blue or red triplet emitter.

In a further embodiment according to the invention, the triplet emitter preferably contains an organometallic connecting unit. The organometallic connecting unit is preferably an organometallic coordination compound. In the present application, an organometallic coordination compound is taken to mean a compound having a metal atom or ion in the centre of the compound surrounded by an organic compound as ligand. In addition, an organometallic coordination compound is characterised in that at least one carbon atom of the ligand is bonded to the central metal via a coordination bond. Electrically neutral triplet emitters are furthermore preferred.

The triplet emitters preferably contain only chelating ligands, i.e. ligands which coordinate to the metal via at least two bonding sites; the use of two or three bidentate ligands, which may be identical or different, is particularly preferred. The preference for chelating ligands is due to the higher stability of chelate complexes.

The triplet emitter here preferably has a structure of the formula (IX):

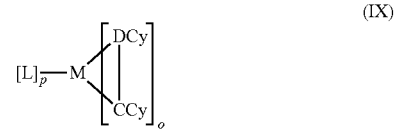

(IX)

where the following applies to the symbols and indices used:

M is on each occurrence, identically or differently, a main-group metal, transition metal or lanthanoid having an atomic number >36;

DCy is on each occurrence, identically or differently, a cyclic group which contains at least one donor atom, i.e. an atom having a free electron pair, preferably nitrogen or phosphorus, via which the cyclic group is bonded to the metal, and which may carry one or more substituents $R^5$; the groups DCy and CCy are connected to one another via a covalent bond and may have further links to one another via the radicals $R^5$ or $R^6$, CCy is on each occurrence, identically or differently, a cyclic group which contains a carbon atom via which the cyclic group is bonded to the metal, and which may carry one or more substituents $R^5$;

L is on each occurrence, identically or differently, a bidentate-chelating ligand, preferably a monoanionic, bidentate-chelating ligand;

$R^5$ is on each occurrence, identically or differently, H, F, Cl, Br, I, $NO_2$, CN, a straight-chain, branched or cyclic alkyl or alkoxy group having 1 to 40 C atoms, where one or more non-adjacent $CH_2$ groups may be replaced by C=O, C=S, C=Se, C=$NR^6$, —$R^6$C=$CR^6$—, —C≡C—, —O—, —S—, —$NR^6$—, Si($R^6$)$_2$ or —$CONR^6$— and where one or more H atoms may be replaced by F, Cl, Br, I, CN, $NO_2$, or an aromatic or heteroaromatic ring system having 5 to 40 aromatic ring atoms, which may be substituted by one or more non-aromatic radicals $R^5$; a plurality of substituents $R^5$ here, both on the same ring and also on the two different rings, may together in turn form a further mono- or polycyclic, aliphatic or aromatic ring system;

R⁶ is, identically or differently on each occurrence, H, an aliphatic hydrocarbon radical having 1 to 20 C atoms or aromatic hydrocarbon radical having 6 to 20 C atoms;

o is on each occurrence 1, 2 or 3, preferably 2 or 3, particularly preferably 3;

p is on each occurrence 0, 1 or 2, preferably 0 or 1, particularly preferably 0.

Preference is likewise given to multinuclear triplet emitters and metal clusters whose common feature is more than one metallic centre.

The units of the formula (IX) can have a symmetrical or asymmetrical structure.

In a preferred embodiment of the invention, the units of the formula (IX) have a symmetrical structure. This preference is due to the easier synthetic accessibility of the compounds. Thus, units of the formula (IX) may preferably be homoleptic metal complexes, i.e. metal complexes which have only one type of ligand.

In a further preferred embodiment of the invention, the units of the formula (IX) have an asymmetrical structure. This may offer advantages in the case of the emission properties if the emission only comes from one of the ligands. Thus, units of the formula (IX) may preferably be heteroleptic complexes, i.e. metal complexes which have more than one different ligand.

Preferred metals M are selected from the group of the transition metals having an atomic number >36; particularly preferred metals M are selected from the group of the transition metals having an atomic number >50. The emitter compound is preferably a metal complex containing a metal selected from the group consisting of the transition metals, the rare earths, the lanthanoids and the actinoids, preferably Ir, Ru, Os, Eu, Au, Pt, Cu, Zn, Mo, W, Rh, Pd and Ag, particularly preferably Ir.

It is furthermore preferred for the organic ligand to be a chelate ligand. A chelate ligand is taken to mean a bi- or polydentate ligand, which may correspondingly be bonded to the central metal via two or more atoms.

In a further embodiment according to the invention, it is preferred for a mixture to comprise a polymer according to the invention, a triplet emitter, which is either present in the polymer according to the invention or, as in the above-mentioned embodiments, has been admixed as low-molecular-weight substance, and further low-molecular-weight substances. These low-molecular-weight substances may have the same functionalities as mentioned for possible building blocks in groups 1 to 8.

The present invention furthermore relates to solutions and formulations comprising one or more polymers or blends according to the invention in one or more solvents. The way in which solutions of this type can be prepared is known to the person skilled in the art and is described, for example, in WO 02/072714 A1, WO 03/019694 A2 and the literature cited therein.

Suitable and preferred solvents are, for example, toluene, anisoles, xylenes, methyl benzoate, dimethylanisoles, mesitylenes, tetralin, veratrols and tetrahydrofuran or mixtures thereof.

These solutions can be used to produce thin polymer layers, for example by area-coating processes (for example spin coating) or by printing processes (for example ink-jet printing).

Polymers which contain structural units of the formula (I) which contain one or more polymerisable and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. For applications of this type, particular preference is given to polymers according to the invention containing one or more polymerisable groups selected from acrylate, methacrylate, vinyl, epoxy and oxetane. It is possible here not only to use corresponding polymers as the pure substance, but also to use formulations or blends of these polymers as described above. These can be used with or without addition of solvents and/or binders. Suitable materials, processes and devices for the methods described above are described, for example, in WO 2005/083812 A2. Possible binders are, for example, polystyrene, polycarbonate, polyacrylate, polyvinylbutyral and similar, opto-electronically neutral polymers.

The polymers, mixtures and formulations according to the invention can be used in electronic or electro-optical devices or for the production thereof.

The present invention thus furthermore relates to the use of the polymers, mixtures and formulations according to the invention in electronic or electro-optical devices, preferably in organic or polymeric organic electroluminescent devices (OLED, PLED), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric organic electroluminescent devices (OLED, PLED), in particular in polymeric electroluminescent devices (PLED).

The way in which OLEDs or PLEDs can be produced is known to the person skilled in the art and is described in detail, for example, as a general process in WO 2004/070772 A2, which should be adapted correspondingly for the individual case.

As described above, the polymers according to the invention are very particularly suitable as electroluminescent materials in PLEDs or displays produced in this way.

Electroluminescent materials in the sense of the present invention are taken to mean materials which can be used in an or as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the polymers or blends according to the invention in a PLED, in particular as electroluminescent material.

The present invention furthermore relates to electronic or opto-electronic components, preferably organic or polymeric organic electroluminescent devices (OLED, PLED), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCS), particularly preferably organic or polymeric organic light-emitting diodes, in particular polymeric organic electroluminescent devices, having one or more active layers, where at least one of these active layers comprises one or more polymers according to the invention. The active layer can be, for example, a light-emitting layer, a charge-transport layer and/or a charge-injection layer.

The present application text and also the examples below are principally directed to the use of the polymers according to the invention in relation to PLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the claims, unless stated otherwise elsewhere.

EXAMPLES

The following syntheses are carried out, unless indicated otherwise, under a protective-gas atmosphere in dried solvents. Starting materials 1, 5, 7 and 12 and the solvents are commercially available.

A) Preparation of the Monomers; Examples 1 and 2

Example 1

Preparation of Compound 6 (M1)

Compound 6 is prepared as follows:

1.1 Compound 2

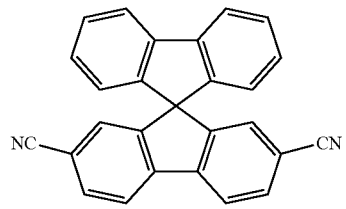

56.6 g (0.6 mol) of copper(I) cyanide is added to a solution of 100.9 g (0.2 mol) of compound 1 in 800 ml of dimethylformamide (DMF). The reaction mixture is stirred at 140° C. for 20 hours, cooled to room temperature and subsequently poured into 1000 ml of 26% aqueous $NH_4OH$. The precipitated solid is filtered off with suction, washed with 10% aqueous $NH_4OH$, water and methanol and employed in the subsequent reaction without further purification. The yield is 65.6 g (0.2 mol, 84%).

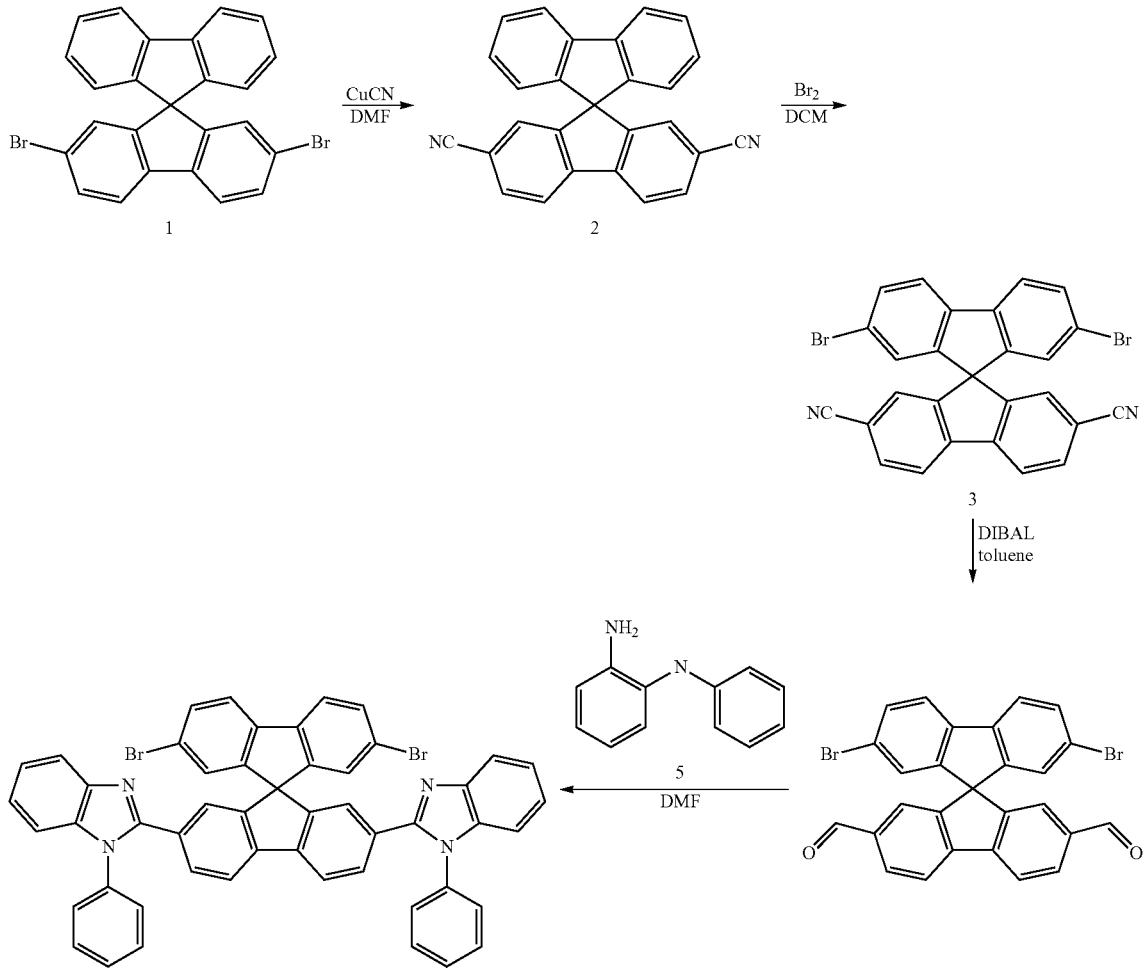

1.2 Compound 3

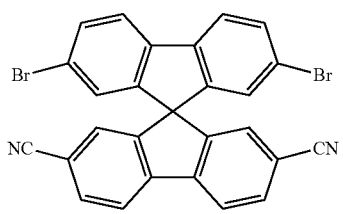

475 ml of an aqueous 0.9 M Na$_2$CO$_3$ solution are added to a solution of 65 g (0.2 mol) of compound 2 in 675 ml of dichloromethane. The reaction mixture is warmed to 60° C., and 70 ml (1.4 mol) of bromine are slowly added dropwise. The reaction mixture is subsequently stirred at 60° C. for 6 hours and at room temperature overnight. The reaction mixture is washed with saturated aqueous Na$_2$SO$_3$ solution and water, the organic phases are dried over sodium sulfate, filtered and evaporated under reduced pressure. The residue is recrystallised from ethanol. The yield is 79.9 g (0.15 mol, 85%).

1.3 Compound 4

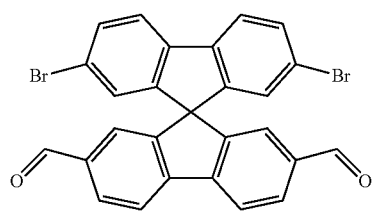

320 ml (0.32 mmol) of diisobutylaluminum hydride (DIBAL) are added dropwise to a solution, cooled to –60° C., of 79.7 g (0.15 mol) of compound 3 in 900 ml of toluene. The reaction mixture is stirred at room temperature overnight, cooled to 0° C., and 700 ml of a 32% aqueous hydrochloric acid solution are added dropwise. The organic phases are washed with water, dried over sodium sulfate, filtered and evaporated under reduced pressure. The residue is recrystallised from ethanol. The yield is 58.0 g (0.11 mol, 72%).

1.4 Compound 6

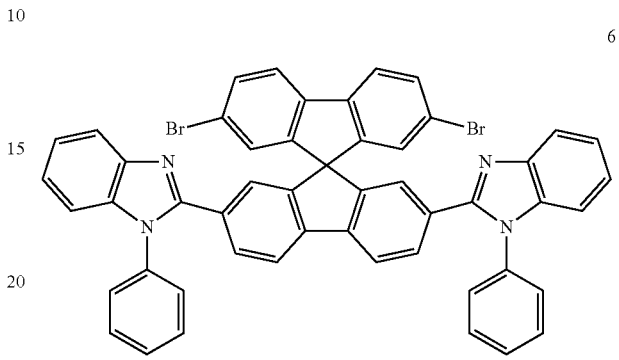

3.4 ml of water, 13.6 g (0.26 mol) of compound 4 and 20.5 g (0.33 mol) of oxone are added to a solution of 10.4 g (56.3 mmol) of N-phenyl-o-phenylenediamine 5 in 100 ml of DMF. The reaction mixture is stirred at room temperature overnight and subsequently poured into 250 ml of a K$_2$CO$_3$ solution with vigorous stirring. The resultant mixture is stirred at room temperature for one hour. The precipitate is filtered off and washed with methanol. The solid is recrystallised from heptane/toluene. The yield is 4.5 g (0.05 mol, 21%).

Example 2

Preparation of Compound 13 (M2)

Compound 13 is prepared as follows:

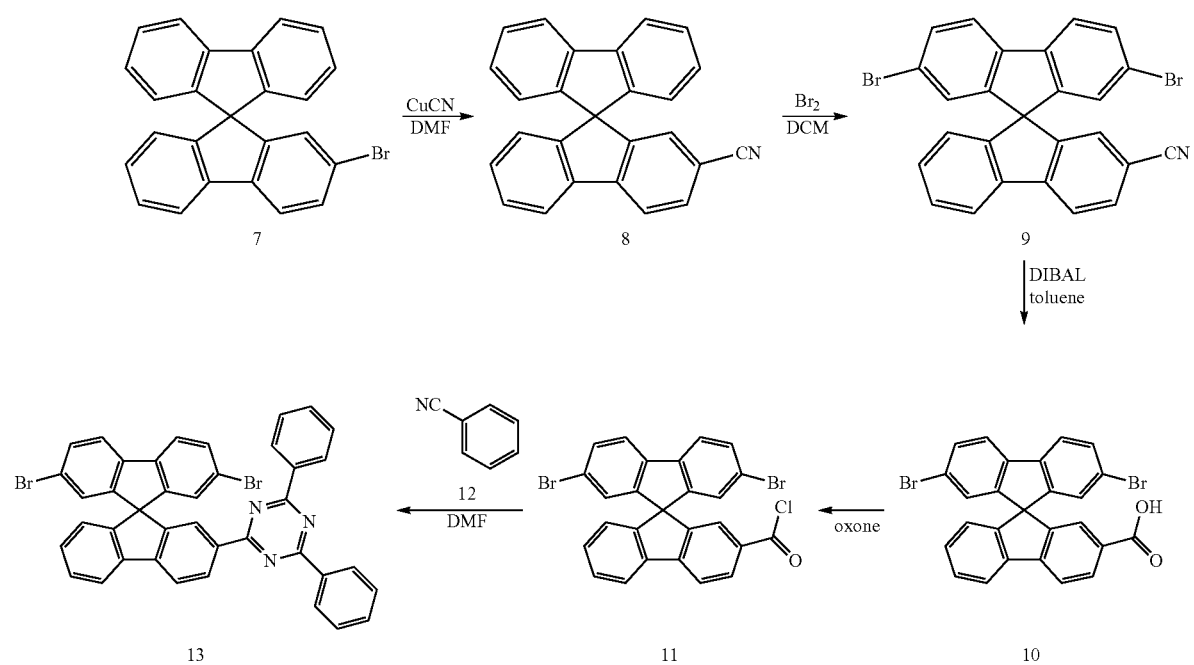

2.1 Compound 8

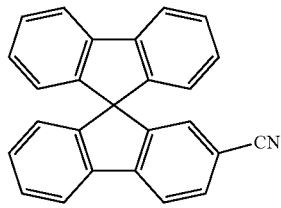

8

30.3 (0.3 mol) of copper(I) cyanide is added to a solution of 45.0 g (0.1 mol) of compound 7 in 400 ml of DMF. The reaction mixture is stirred at 140° C. for 20 hours, cooled to room temperature and subsequently poured into 500 ml of 26% aqueous NH$_4$OH. The precipitated solid is filtered off with suction, washed with 10% aqueous NH$_4$OH, water and methanol and employed in the subsequent reaction without further purification. The yield is 32.9 g (0.1 mol, 85%).

2.2 Compound 9

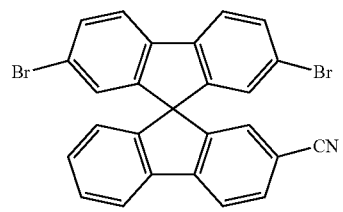

9

800 ml of an aqueous 1.0 M Na$_2$CO$_3$ solution are added to a solution of 102.1 g (0.3 mol) of compound 8 in 1100 ml of dichloromethane (DCM). The reaction mixture is warmed to 60° C., and 114 ml (2.2 mol) of bromine are slowly added dropwise. The reaction mixture is subsequently stirred at 60° C. for 6 hours and at room temperature overnight. The reaction mixture is washed with saturated aqueous Na$_2$SO$_3$ solution and water, the organic phases are dried over sodium sulfate, filtered and evaporated under reduced pressure. The residue is recrystallised from ethanol. The yield is 73.7 g (0.15 mol, 49%).

2.3 Compound 10

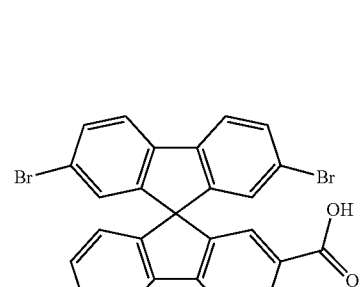

10

89.6 g (0.18 mol) of compound 9 and 215 ml of sodium hydroxide solution are initially introduced in 215 ml of etha-nol. The reaction mixture is stirred under reflux for 6 hours and at room temperature overnight. The reaction solution is evaporated under reduced pressure, and 400 ml of hydrochloric acid solution (5M) are added. The reaction mixture is stirred at 60° C. for 2 hours. The precipitated solid is filtered off with suction, washed with water and employed in the subsequent reaction without further purification. The yield is 54.3 g (0.10 mol, 58%).

2.4 Compound 11

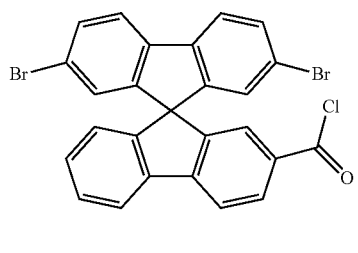

11

46.3 g (0.09 mol) of compound 10 are added to a solution, cooled to 0° C., of 525 ml (7.24 mol) of SOCl$_2$. The reaction mixture is stirred under reflux for 2 hours, evaporated under reduced pressure and employed in the subsequent reaction without further purification. The yield is 45.2 g (0.08 mol, 94%).

2.5 Compound 13

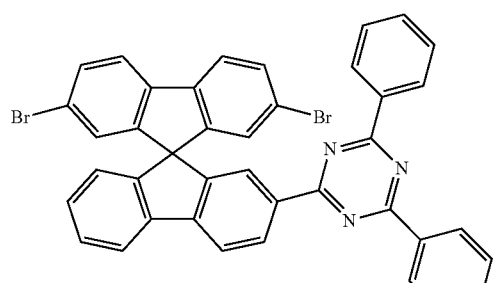

13

47.9 g (0.09 mol) of compound 11, 19.3 ml (0.19 mol) of benzonitrile 12, 1.9 ml (0.03 mol) of SOCl$_2$, 11.9 g (0.09 mol) of Al$_2$O$_3$ and 9.549 g (0.18 mol) of NH$_4$Cl are initially introduced in 250 ml of o-dichlorobenzene and stirred at 100° C. for 16 hours. The reaction mixture is cooled to room temperature and poured into 3500 ml of ethanol. The precipitate is filtered off and washed with methanol. The solid is recrystallised from toluene. The yield is 22.7 g (0.03 mol, 36%).

B) Preparation of the Polymers, Examples 3 to 6

Polymers P1 to P3 according to the invention and comparative polymer V1 are synthesised using the following monomers (percent data=mol %) by SUZUKI coupling in accordance with WO 03/048225 A2.

Example 3
Polymer P1
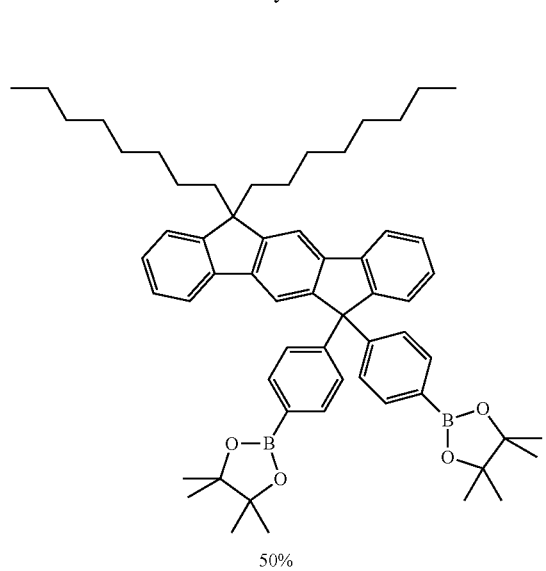
50%
+
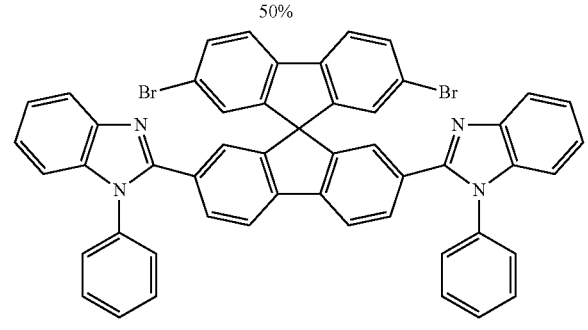
50%
Example 4
Polymer P2
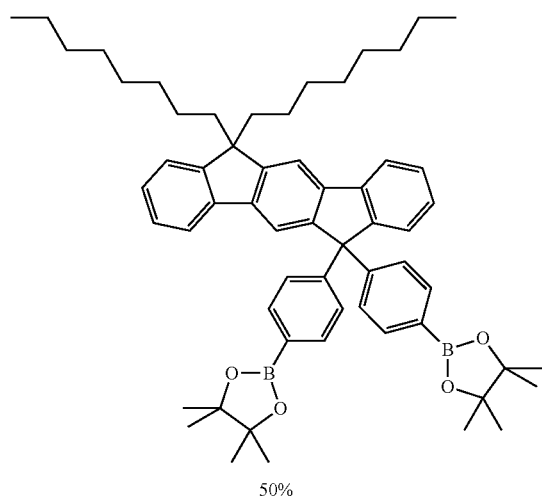
50%
+
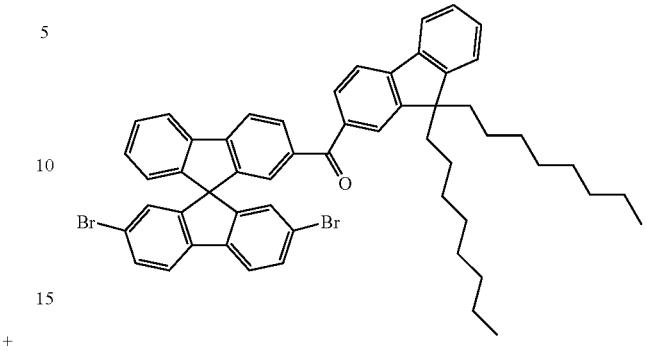
50%
Example 5
Polymer P3
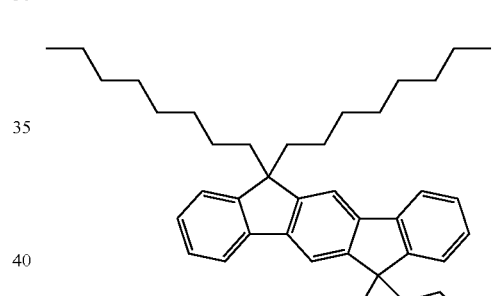
50%
+
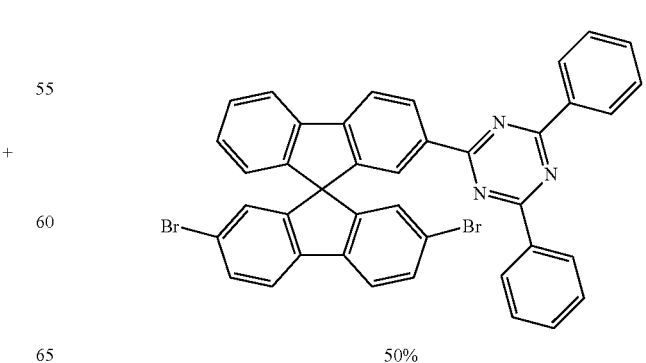
50%

Comparative Example 6

Polymer V1

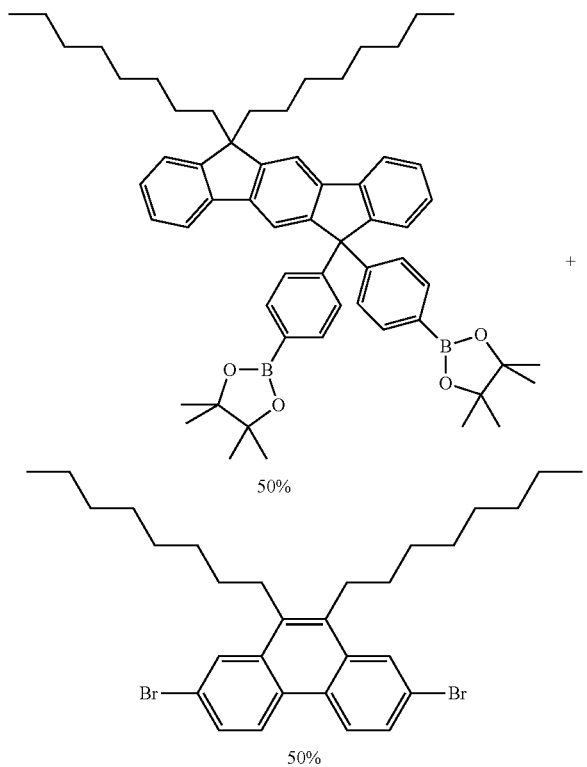

C) Production of PLEDs, Examples 7 to 10

The materials according to the invention are processed from solution and thus result in devices which can be produced in a significantly simpler manner, having nevertheless good properties. The production of such components is based on the production of polymeric light-emitting diodes (PLEDs), which has already been described many times in the literature (for example in WO 2004/037887 A2). In the present case, the compounds according to the invention are dissolved in toluene or chlorobenzene. The concentration employed in the examples given here is 20% by weight of emitter T1 and 80% by weight of polymer P1 to P3 or V1. The typical solids content of such solutions is between 10 and 15 g/l if, as here, the typical layer thickness of 80 nm for a device is to be achieved by means of spin coating.

Structure of emitter T1

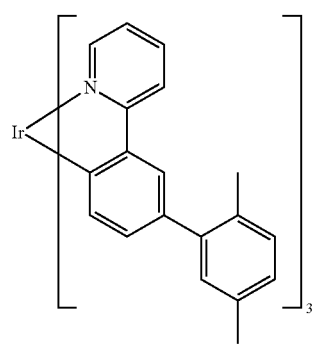

T1

A typical device has the structure depicted in FIG. 1.

To this end, specially manufactured substrates from Technoprint are used in a layout designed specifically for this purpose (FIG. 2, diagram on the left: ITO structure applied to the glass support, diagram on the right: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are obtained with the cathode vapour-deposited at the end of the production process.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H.C. Starck, Goslar, which is supplied as an aqueous dispersion) is then applied by spin coating, likewise in the clean room. The spin rate required depends on the degree of dilution and the specific spin-coater geometry (typical for 80 nm: 4500 rpm). In order to remove residual water from the layer, the substrates are dried by heating on a hotplate at 180° C. for 10 minutes. Then, under an inert-gas atmosphere (nitrogen or argon), firstly 20 nm of an interlayer (interlayer concentration: 5 g/l, typically a hole-dominated polymer, here HIL-012 from Merck) and then 80 nm of the polymer layers are applied from toluene solutions. Both layers are dried by heating at 180° C. for at least 10 minutes. The Ba/Al cathode is then vapour-deposited in the pattern indicated through a vapour-deposition mask (high-purity metals from Aldrich, particularly barium 99.99% (Order No. 474711); vapour-deposition units from Lesker or others, typical vacuum level $5\times10^{-6}$ mbar). In order, in particular, to protect the cathode against air and atmospheric moisture, the device is finally encapsulated and then characterised.

Figure 3:
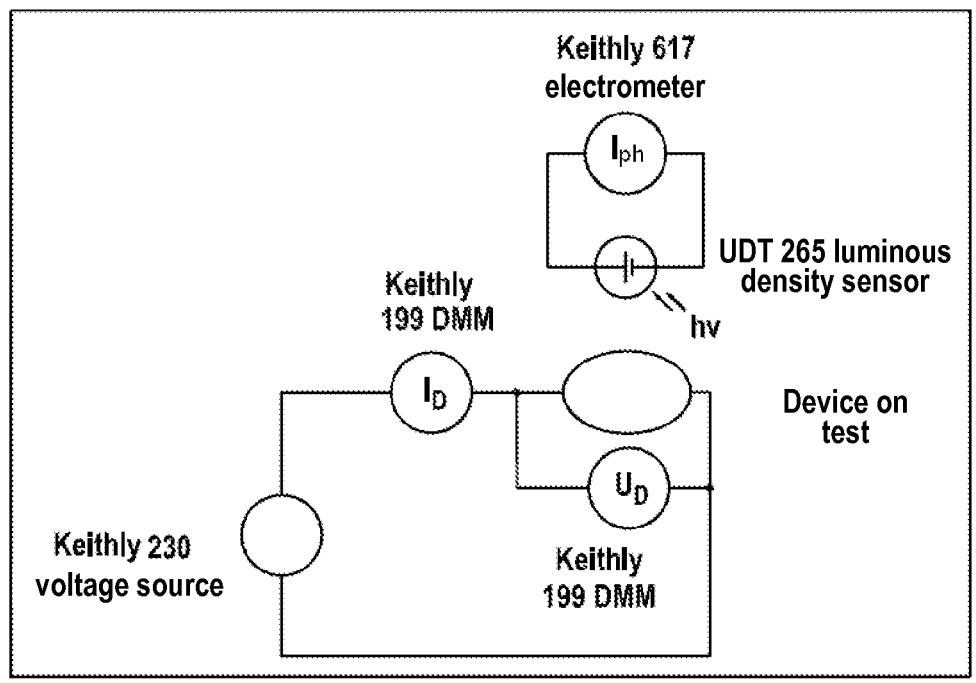
FIG. 3 illustrates the typical measure¬ment set-up.

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained is measured by the photodiode. In this way, the IVL data of the test devices are obtained. Important parameters are the maximum efficiency measured ("max. eff." in cd/A) and the voltage required for 100 cd/m$^2$.

In order, in addition, to know the colour and the precise electroluminescence spectrum of the test devices, the voltage required for 100 cd/m$^2$ is applied again after the first measurement, and the photodiode is replaced by a spectrum measuring head. This is connected to a spectrometer (Ocean Optics) by an optical fibre. The colour coordinates (CIE: Commission Intrnationale de l'Eclairage, standard observer from 1931) can be derived from the measured spectrum.

The solution-processed devices are characterised by standard methods, the OLED examples given are not optimised.

The results obtained on use of polymers P1 to P3 and comparative polymer V1 in PLEDs are summarised in Table 1.

TABLE 1

| | | Results in the device configuration of FIG. 1 | | |
|---|---|---|---|---|
| Example | Polymer | Max. eff [cd/A] | U @ 100 cd/m² [V] | CIE [x/y] |
| 7 | V1 | 8.2 | 8.5 | 0.32/0.63 |
| 8 | P1 | 20.3 | 5.9 | 0.34/0.62 |
| 9 | P2 | 22.9 | 5.5 | 0.33/0.62 |
| 10 | P3 | 24.2 | 5.3 | 0.33/0.62 |

As can be seen from the results, polymers P1 to P3 according to the invention represent a significant improvement over the comparable polymer in accordance with the prior art with respect to operating voltage, and efficiency.

The invention claimed is:

1. A compound of the following formula (VIII):

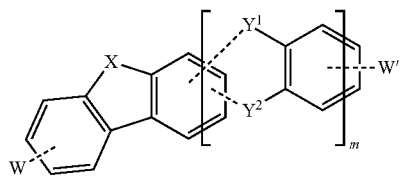

(VIII)

where the symbols and indices used have the following meaning:

W and W' are selected, independently of one another, from the group consisting of halogen, O-tosylate, O-triflate, O—SO$_2$R$^4$, B(OR$^4$)$_2$ and Sn(R$^4$)$_3$, where R$^4$ is selected on each occurrence, independently of one another, from the group consisting of H, an aliphatic hydrocarbon radical having 1 to 20 C atoms and an aromatic hydro-carbon radical having 6 to 20 ring atoms, and where two or more radicals R$^4$ may also form an aliphatic ring system with one another; and X is selected from NR$^1$, C(R$^1$)$_2$—C(R$^1$)$_2$, CR$^1$=CR$^1$ and

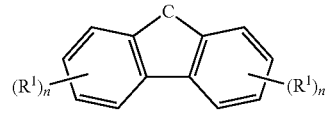

Y$^1$ and Y$^2$ are each selected, independently of one another, from C(R$^1$)$_2$, NR$^1$, C(R$^1$)$_2$—C(R$^1$)$_2$, CR$^1$=CR$^1$ and a single bond, but with the proviso that either Y$^1$ or Y$^2$ is a single bond, R$^1$ is in each case selected, independently of one another, from H, D, F, Cl, Br, I, N(Ar$^1$)$_2$, C(=O)Ar$^1$, P(=O)Ar$^1$$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, OSO$_2$R$^2$, a straight-chain alkyl, alkoxy or thioalkoxy group having 1 to 40 C atoms, a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, an aryl, aryloxy, heteroaryl or heteroaryloxy group having 5 to 40 C atoms, which is optionally substituted by one or more non-aromatic radicals R$^1$, where, in addition, two or more radicals, R$^1$ may form an aliphatic or aromatic, mono- or polycyclic ring system with one another, or an electron-transport unit R$^3$, but with the proviso that at least one of the radicals R$^1$ is an electron-transport unit R$^3$, Ar$^1$ is selected on each occurrence, in each case independently of one another, from an aryl or heteroaryl group or an aromatic or heteroaromatic ring system, R$^2$ is in each case, independently of one another, H, an aliphatic hydrocarbon radical having 1 to 20 C atoms or an aromatic hydrocarbon radical having 6 to 20 C atoms, where two or more radicals R$^2$ may also form a ring system with one another, R$^3$ is an electron-transport unit, n is in each case, independently of one another, 1, 2, 3 or 4, and m is 1.

2. The compound according to claim 1, wherein Y$^1$ and Y$^2$ are each selected, independently of one another, from NR$^1$, C(R$^1$)$_2$—C(R$^1$)$_2$, CR$^1$=CR$^1$ and a single bond, but with the proviso that either Y$^1$ or Y$^2$ is a single bond.

3. A polymer which contains at least one structural unit of the following formula (I):

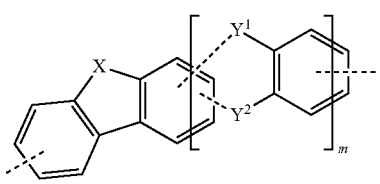

(I)

where the symbols and indices used have the following meaning:

X is NR$^1$, C(R$^1$)$_2$—C(R$^1$)$_2$, CR$^1$=CR$^1$ or

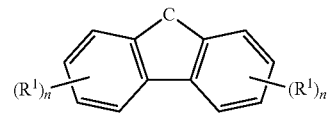

Y$^1$ and Y$^2$ are each selected, independently of one another, from C(R$^1$)$_2$, C(R$^1$)$_2$—C(R$^1$)$_2$, CR$^1$=CR$^1$ and a single bond, but with the proviso that either Y$^1$ or Y$^2$ is a single bond, m is 1, R$^1$ is in each case selected, independently of one another, from H, D, F, Cl, Br, I, N(Ar$^1$)$_2$, C(=O)Ar$^1$, P(=O)Ar$^1$$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, OSO$_2$R$^2$, a straight-chain alkyl, alkoxy or thioalkoxy group having 1 to 40 C atoms, a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, an aryl, aryloxy, heteroaryl or heteroaryloxy group having 5 to 40 C atoms, which is optionally substituted by one or more non-aromatic radicals R$^1$, where, in addition, two or more radicals, R$^1$ may form an aliphatic or aromatic, mono- or polycyclic ring system with one another, or an electron-transport unit R$^3$, but with the proviso that at least one of the radicals R$^1$ is an electron-transport unit R$^3$, Ar¹ is selected on each occurrence, in each case independently of one another, from an aryl or heteroaryl group or an aromatic or heteroaromatic ring system, R² is in each case, independently of one another, H, an aliphatic hydrocarbon radical having 1 to 20 C atoms or an aromatic hydrocarbon radical having 6 to 20 C atoms, where two or more radicals R² may also form a ring system with one another, R³ is an electron-transport unit, and where the dashed lines represent the bonds to the adjacent structural units in the polymer.

4. The polymer according to claim 3, wherein two adjacent radicals, R¹ form an aliphatic or aromatic, mono- or polycyclic ring system with one another, or an electron-transport unit R³, but with the proviso that at least one of the radicals R¹ is an electron-transport unit R³.

5. The polymer according to claim 3, wherein R³ is a unit which is selected from the group consisting of benzimidazole, triazine, pyrimidines, pyrazines, pyridazines, phenanthrolines, ketones, phosphine oxides and derivatives thereof.

6. The polymer according to claim 3, wherein besides the structural units of the formula (I), it also contains further structural units which are different from those of the formula (I).

7. The polymer according to claim 3, wherein the proportion of the units of the formula (I) is 0.01 to 100 mol %, based on the total number of recurring units of the polymer.

8. A process for the preparation of the polymer according to claim 3, wherein the polymer is prepared by Suzuki, Yamamoto, Stille or Hartwig-Buchwald polymerisation.

9. A mixture of one or more polymers according to claim 3 with a further polymeric, oligomeric, dendritic and/or low-molecular-weight substance.

10. A solution or formulation comprising the mixture according to claim 9 in one or more solvents.

11. An organic electroluminescent device which comprises the mixture according to claim 9.

12. An organic electronic device having one or more active layers, wherein at least one of these active layers comprises the mixture according to claim 9.

13. The organic electronic device according to claim 12, wherein the device is an organic or polymeric organic electroluminescent device (OLED, PLED), an organic integrated circuit (O-IC), an organic field-effect transistor (OFET), an organic thin-film transistor (OTFT), an organic solar cell (O-SC), an organic laser diode (O-laser), an organic photovoltaic (OPV) element or device or an organic photoreceptor (OPC).

14. The organic electronic device according to claim 12, wherein the device is a polymeric organic electroluminescent device (PLED).

15. A solution or formulation comprising one or more polymers according to claim 3 in one or more solvents.

16. An organic electroluminescent device which comprises one or more polymers according to claim 3.

17. An organic electronic device having one or more active layers, wherein at least one of these active layers comprises one or more polymers according to claim 3.

18. The polymer according to claim 3, wherein R³ is a unit which is selected from the group consisting of benzimidazole, triazine, pyrimidines, pyrazines, pyridazines, phenanthrolines, ketones, phosphine oxides and derivatives thereof.

19. The polymer according to claim 3, wherein Y¹ and Y² are each selected, independently of one another, from NR¹, C(R¹)₂—C(R¹)₂, CR¹=CR¹ and a single bond, but with the proviso that either Y¹ or Y² is a single bond.

20. A compound of the following formula (VIII):

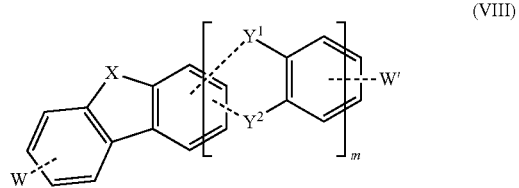

(VIII)

where the symbols and indices used have the following meaning:

W and W' are selected, independently of one another, from the group consisting of halogen, O-tosylate, O-triflate, O—SO₂R⁴, B(OR⁴)₂ and Sn(R⁴)₃, where R⁴ is selected on each occurrence, independently of one another, from the group consisting of H, an aliphatic hydrocarbon radical having 1 to 20 C atoms and an aromatic hydro-carbon radical having 6 to 20 ring atoms, and where two or more radicals R⁴ may also form an aliphatic ring system with one another; and X is C(R¹)₂;

Y¹ and Y² are each selected from C(R¹)₂ and a single bond, but with the proviso that either Y¹ or Y² is a single bond;

R¹ is an aryl, aryloxy, heteroaryl or heteroaryloxy group having 5 to 40 carbon atoms, which is substituted by one or more non-aromatic radicals R¹, but with the proviso that at least one of the non-aromatic radicals R¹ is an electron-transport unit R³;

R³ is an electron-transport with the proviso R³ is not triazine, and m is 1.

* * * * *